United States Patent [19]

Kressel et al.

[11] 4,174,252
[45] Nov. 13, 1979

[54] METHOD OF DEFINING CONTACT OPENINGS IN INSULATING LAYERS ON SEMICONDUCTOR DEVICES WITHOUT THE FORMATION OF UNDESIRABLE PINHOLES

[75] Inventors: Henry Kressel, Elizabeth; Mark A. Spak, Edison, both of N.J.

[73] Assignee: RCA Corporation, New York, N.Y.

[21] Appl. No.: 928,310

[22] Filed: Jul. 26, 1978

[51] Int. Cl.$^2$ ............... H01L 21/285; H01L 21/306; H01L 21/314
[52] U.S. Cl. ........................... 156/653; 156/657; 156/662; 252/79.2; 357/54; 357/59; 156/659.1; 156/661.1
[58] Field of Search .............. 156/662, 659, 657, 644, 156/661, 653; 252/79.2; 357/54, 59

[56] References Cited

U.S. PATENT DOCUMENTS

| | | | |
|---|---|---|---|
| 3,592,707 | 7/1971 | Jaccodine | 156/657 |
| 3,673,018 | 6/1972 | Dingwall | 156/659 |
| 3,967,310 | 6/1976 | Horiuchi et al. | 357/54 |
| 4,001,873 | 1/1977 | Kajiwara et al. | 357/59 |
| 4,014,037 | 3/1977 | Matsushita et al. | 357/54 |
| 4,062,707 | 12/1977 | Morchizucki et al. | 357/54 |
| 4,063,275 | 12/1977 | Matsushita et al. | 357/54 |
| 4,134,125 | 1/1979 | Adams et al. | 357/54 |

OTHER PUBLICATIONS

Winter et al., "Pinhole Detection . . . Oxides", *IBM Technical Disclosure Bulletin*, vol. 13, No. 12 (5/71), p. 3632.
Schwartz et al., "Chemical . . . Silicon", Journal of Electrochemical Society, Dec. 1976, pp. 1903-1909.

*Primary Examiner*—Jerome W. Massie
*Attorney, Agent, or Firm*—Birgit E. Morris

[57] ABSTRACT

A p-n junction silicon semiconductor device passivated with a first layer of oxygen-doped polycrystalline silicon and a second layer of silicon nitride, is treated to provide contact openings through to the silicon substrate by first depositing an undoped polycrystalline silicon layer over the silicon nitride layer, coating with photoresist, exposing and developing the photoresist to provide an opening to the polycrystalline silicon layer, etching through said latter layer with a particular etchant solution that etches large diameter openings at a faster rate than small diameter openings, and etching through the passivating layers whereby the desired contact opening is etched through to the substrate but pinhole openings less than about 2 microns in diameter in the photoresist layer are not propagated through the passivating layers.

9 Claims, 6 Drawing Figures

METHOD OF DEFINING CONTACT OPENINGS IN INSULATING LAYERS ON SEMICONDUCTOR DEVICES WITHOUT THE FORMATION OF UNDESIRABLE PINHOLES

This invention relates to an improved method of defining contact openings in a layer or layers of passivating material on the surface of a semiconductor device.

BACKGROUND OF THE INVENTION

Semiconductor devices such as silicon devices having exposed p-n junctions, are generally passivated by depositing an inert material such as silicon dioxide or silicon nitride thereover. The use of oxygen-doped polycrystalline silicon as a passivating layer is described in U.S. Pat. No. 4,014,037. This material provides a number of good passivating properties, but is sensitive to ionic motion which eventually may result in degraded electrical characteristics in the device. Therefore, it has been proposed to deposit a layer of silicon nitride on top of an oxygen-doped silicon layer to inhibit ion migration.

Regardless of the passivating materials used to protect the surfaces of semiconductor devices, and the above mentioned materials are only examples, another problem arises when these layers are defined for the purpose of opening holes to expose the surface of the semiconductor body where electrical contacts are to be made.

Openings in the layers of passivating material are usually defined using various combinations of masking materials, photoresists and etching solutions. For example, in the past it has been common practice to cover the top silicon nitride passivating layer (or layer of other passivating material) with a layer of a masking material such as silicon dioxide or borosilicate glass and then define this layer and the passivating layers beneath with the aid of an organic photoresist.

It is well known that photoresist layers are subject to imperfections such as pinholes, especially in devices having irregular contours like mesa transistors. When the pinholes extend completely through the photoresist layer, etchant solutions subsequently used to remove underlying masking material where contact openings are being made, will also remove masking material beneath the pinholes and, subsequently, these pinholes may be propagated through the passivating layers to the device surface. The problem is aggravated because pinholes also often occur in the masking layer and in the passivating layer.

The underlying reason why material beneath the pinholes in the photoresist layer is etched completely through the masking and passivating layers at the same time as the much larger contact openings are etched through these same materials is that etching occurs at about the same rate, regardless of the diameter of the hole being etched. That is, these etchants have been "surface rate" controlled.

DETAILED DESCRIPTION OF A PRIOR ART PROCESS

This process can be described in detail with reference to FIG. 1. FIG. 1 illustrates a mesa-type transistor comprising a body of monocrystalline silicon passivated with multilayers of inert material through which an opening is to be made. The device illustrated in FIG. 1 includes a p-type emitter portion 4, an n-type base portion 6 and a p-type collector portion 8. Between the p-type emitter portion 4 and the n-type base portion 6 is a p-n junction 10. Between the n-type base portion 6 and the p-type collector portion is a second p-n junction 12.

The surface of the device, including the areas where the contact openings are to be made and two edge-exposed junctions, is covered with a first passivating layer 14 of oxygen-doped polycrystalline silicon. On top of the first passivating layer 14 is a second passivating layer 16 of silicon nitride ($Si_3N_4$).

A typical method of making a relatively large contact opening 18 to the emitter layer 4 includes the step of depositing a masking layer 20 over the entire surface of the second passivating layer 16. This prior art masking layer may be either silicon dioxide or borosilicate glass, for example.

A layer of an organic photoresist 22 is deposited over the entire surface of the masking layer 20.

The organic photoresist layer 22 is exposed to a photomask pattern of light and shadow. If the photoresist is of the negative type, i.e., where those parts of the resist which are exposed to light become less soluble, a darkened area of the photomask will correspond to the area where the opening 18 is to be made and the remainder of this portion of the photomask will be transparent to light.

The photoresist layer 22 is then developed to remove the more soluble portion defining the opening 18, by contacting it with a suitable solvent. The more insoluble portions of the photoresist layer remain.

Next, the uncovered portions of the silicon dioxide or borosilicate glass masking layer 20 are removed by etching. A typical etching solution for either of these materials is a 1 to 10 percent by weight aqueous hydrofluoric acid solution.

If the photoresist layer 22 is imperfect in that it contains one or more pinholes 24 (usually 1-2 microns in diameter), the etching solution will penetrate through the pinholes and etch through the masking layer 20 at these points, in addition to etching away the layer 20 where the opening 18 is desired.

The next step in the process is to remove the remaining portions of the photoresist layer 22 with a suitable solvent, thus uncovering the entire surface of the layer 20 of borosilicate glass or silicon dioxide.

The uncovered portion of the silicon nitride layer 16 is then etched with hot phosphoric acid solution to remove the portion where the opening 18 is being made. However, since the entire surface of the device is bathed in the etchant, it will penetrate the extension of pinhole 24 and also etch through the silicon nitride layer where the original pinhole 24 was located.

Finally, the uncovered portion of the oxygen-doped polycrystalline silicon layer 14 is etched away, using a one percent by weight aqueous solution of KOH. Again, not only is that part of the layer 14 removed where the opening 18 is to be made, but the portion beneath the original pinhole 24 will also be removed.

Thus, wherever an imperfection, such as a pinhole, existed in the top photoresist layer 22, the imperfection may be propagated through all the layers down to the surface of the semiconductor body. Subsequently, when metal is deposited within the opening 18 to make an electrical connection to the semiconductor layer 4, metal will also be deposited where the original imperfections existed.

SUMMARY OF THE INVENTION

The present invention is based on the discovery that etching through of small-diameter imperfections in a masking layer at the same time larger contact openings are being etched can be largely inhibited, or prevented entirely, by selecting a combination of masking material and etchant, such that the etching rate for very small diameter openings, i.e., below about 2 microns, is less than the etching rate for relatively large diameter openings, i.e., about 10 microns or more. This enables a relatively large opening to be etched without etching a very small opening completely through the layer of masking material of the same controlled thickness.

The improved method therefore comprises covering the passivating layer or layers of a semiconductor device with a particular masking material, deposited to a controlled minimum thickness, and then also using particular etchants in combination therewith, such that when relatively large openings are etched through the masking layer, very small diameter openings will be only partially etched through the layer.

DETAILED DESCRIPTION OF THE INVENTION

Individual steps in an embodiment of the method of the present invention are illustrated in FIGS. 2 to 6. The device 25 in FIGS. 2 to 6, is similar to the device 2 shown in FIG. 1.

Figure 1:
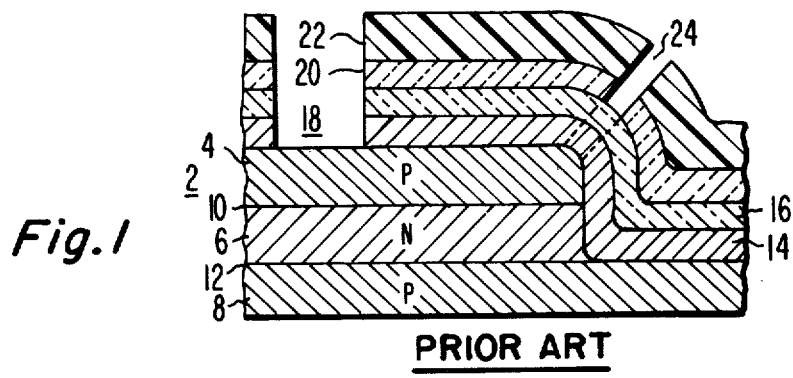
FIG. 1 is a partial cross section view of one type of semiconductor device illustrating the prior art.
Figure 2:
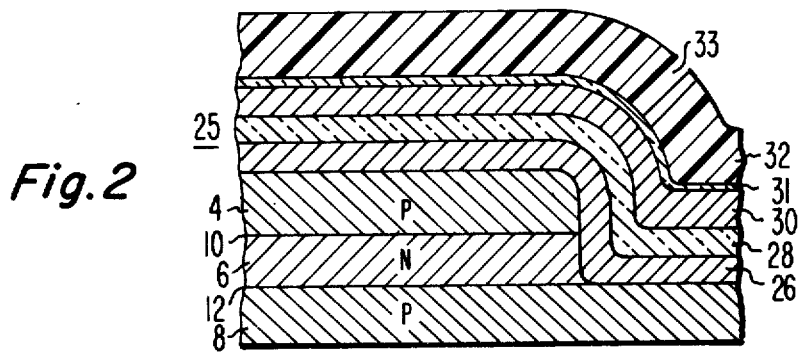
FIGS. 2 to 6 are partial cross section views illustrating an embodiment of successive steps of the method of the present invention using the same device as FIG. 1.

As shown in FIGS. 3-6, an opening, shown as 34 a-d, corresponding to the opening 18 of FIG. 1, is to be made so that an electrical connection may be made to the surface of the semiconductor layer 4.

As in the prior art, a layer of oxygen-doped polycrystalline silicon 26 is first deposited on the surface of the semiconductor layer 4. This layer may contain, for example, 20 mol percent of oxygen and have a thickness of about 5000 angstroms. This layer may be deposited in a conventional manner in a pressure reactor by chemical vapor deposition.

Next, also as in the prior art, a layer 28 of silicon nitride is deposited on top of the layer 26 of oxygen-doped polycrystalline silicon. The silicon nitride layer 28 may have a thickness of about 1000 angstroms and may also be deposited in conventional manner by chemical vapor deposition.

Unlike the prior art, the next step in the present method is to deposit a masking layer 30 of undoped polycrystalline silicon or amorphous silicon on top of the layer 28 of silicon nitride. The thickness of this layer is preferably 2 to 10 microns but is at least twice the diameter of the pinholes to be stopped in this layer. Generally, photoresist pinholes are on the order of 1–2 microns in diameter. But larger pinholes would require that a thicker undoped polycrystalline silicon or amorphous silicon masking layer be applied. The polycrystalline or amorphous silicon layer 30 may be deposited by decomposition of $SiH_4$ at 650°–760° C. at atmospheric or lower pressure in known manner.

In order to increase the adhesion of the next-to-be-deposited photoresist layer to the polycrystalline silicon layer 30, the surface portions of the polycrystalline silicon layer 30 may be oxidized to form a thin surface layer 31 of $SiO_2$. This may be done by treating the polycrystalline silicon layer 30 with steam at 700°–900° C. for a time sufficient to grow a $SiO_2$ layer about 200 angstroms thick. This step is preferred but is optional.

Finally, a layer 32 of photoresist, preferably having a thickness of about 3 to 8 microns, is deposited on the polycrystalline silicon layer 30 or the $SiO_2$ layer 31. The photoresist should be one that resists the solvent action of the etching solution that will be used to define the undoped polycrystalline silicon layer 30 and the $SiO_2$ layer 31, for the time it will take to etch through the polycrystalline silicon layer 30 and the $SiO_2$ layer 31. A suitable photoresist is Waycoat SC (Reg. T.M.) sold by the Hunt Chemical Co. This is a negative type photoresist. The photoresist layer 32 may have spurious openings such as pinhole 33 extending through it.

The photoresist layer 32 is then exposed to a pattern of light and shadow with the dark areas being located where openings, such as openings 34a-d, are to be made in the layer (FIGS. 3–6).

Figure 3:
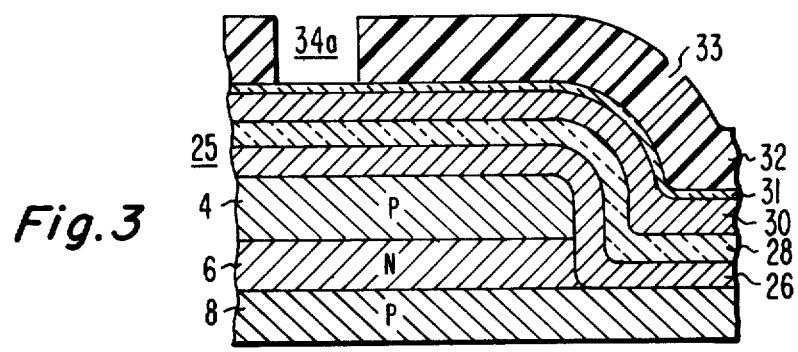

The photoresist layer 32 is then developed in conventional manner to remove the more soluble portions and form an opening 34a where the photoresist has been removed (FIG. 3).

If a layer 31 of $SiO_2$ is present, it is next removed using either 1–10 percent by weight HF aqueous solution or a solution of $NH_4F$ and HF in a ratio of 60:1 by weight. The etchant will also penetrate the pinhole 33 and remove the $SiO_2$ layer 31 beneath the pinhole opening.

The next step is to remove the uncovered portion of the undoped polycrystalline silicon layer 30 in the opening 34a.

Suitable etchants are mixtures of concentrated nitric and hydrofluoric acids, in proportions of from about 65 to 99 volume percent of 70 weight percent $HNO_3$ and from about 35 to 1 volume percent of 49 weight percent HF, respectively. The mixtures can contain acetic acid as a diluent. A preferred etchant is a solution of 99 volume percent of 70 percent by weight $HNO_3$ and 1 volume percent of 49 percent by weight HF.

Figure 4:
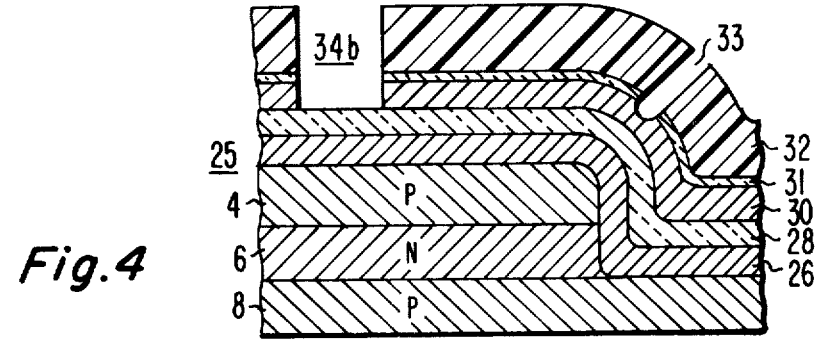
Figure 5:
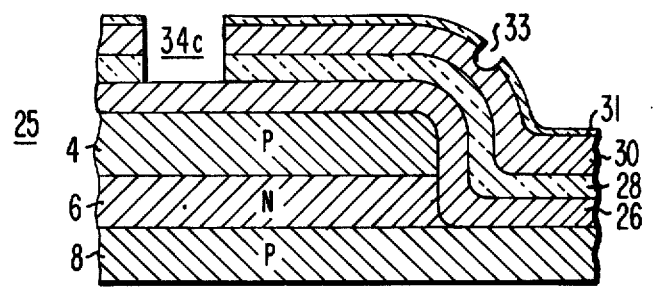

The etching is preferably carried out at a temperature below 0° C., preferably from −10° C. to just below 0° C. Etching at low temperatures slows down the reaction rate and increases the solution viscosity, thereby maximizing the differences in etch rate between the large diameter openings and the small, pinhole openings which gives more diffusion control rather than surface control. This removes that portion of the polycrystalline silicon layer 30 in the opening 34a to form the deeper opening 34b (FIG. 4). But only part of the thickness of the layer 30 beneath the pinhole opening 33 is removed. The reason for this is that, with this material, i.e., polycrystalline or amorphous silicon, this etchant has the property that it etches at a slower rate in small diameter openings below about 2 microns, than it does in larger diameter openings.

Figure 6:
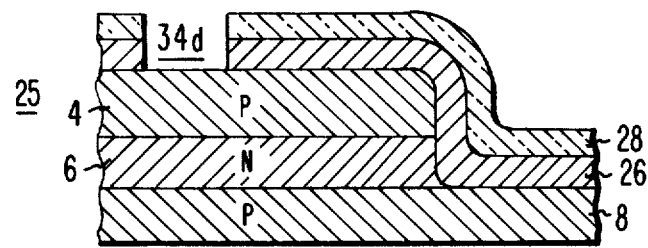

Next, the photoresist layer 32 is removed in conventional manner, the $Si_3N_4$ layer 28 is etched in concentrated phosphoric acid at 200° C. to form opening 34c (FIG. 5) and the oxygen-doped polycrystalline silicon layer 26 is etched in a solution of 1 weight percent KOH at the boiling point to form opening 34d (FIG. 6). This etching treatment also removes the entire undoped polycrystalline silicon layer 30 and the silicon oxide layer 31, since the undoped polycrystalline silicon etches at a faster rate than oxygen-doped polycrystalline silicon. This leaves the opening 34d (FIG. 6) and the device passivated with successive layers of oxygen-doped polycrystalline silicon and Si₃N₄.

The invention will be further illustrated by the following Examples, but the invention is not to be limited to the details described therein. In the Examples, percent is by weight.

EXAMPLE 1

A mesa type silicon transistor comprising p-type, n-type and p-type layers as shown in FIG. 1, was coated with a first layer of oxygen-doped polycrystalline silicon about 5000 angstroms thick, and a layer of silicon nitride about 1000 angstroms thick. A layer of undoped polycrystalline silicon about 2 microns thick was then deposited and the surface oxidized to a depth of about 200 angstroms by treatment with steam at 700°–900° C.

A layer of Waycoat SC photoresist was applied to the coated device, exposed to a pattern and developed to form an opening where a desired contact was to be applied.

The silicon oxide layer exposed was removed with a dilute HF solution. Any pinholes in the photoresist layer would be penetrated by this solution.

The polycrystalline silicon layer exposed was then removed with an etchant made by mixing 99 ml of concentrated nitric acid and 1 ml of 49 percent HF. The etching step was carried out at about −5° C.

The remaining photoresist layer was removed with Caro's acid. The exposed silicon nitride was removed with concentrated phosphoric acid at 200° C. A final etch of 1 percent aqueous boiling KOH removed the exposed oxygen-doped polycrystalline silicon layer, thereby exposing the underlying silicon device, and removed the silicon oxide and undoped polycrystalline silicon as well.

EXAMPLE 2

A series of very small openings of various sizes was monitored during etching for 3 minutes using substrates coated with the polycrystalline silicon layer and photoresist layer of Example 1. The etchant solution employed was an aqueous solution made by mixing 100 ml of 49 percent HF, 200 ml of acetic acid and 200 ml of concentrated nitric acid, also at about −5° C. The opening size and etch rates are summarized below:

| Diameter, microns | Etch Rate, microns/min. |
|---|---|
| 10 | 5 |
| 8 | 4.5 |
| 6 | 4 |

Thus, the smaller the opening, the slower the etch rate.

We claim:

1. In a method of defining a contact opening to a semiconductor device having one or more passivating layers thereon whereby an inert layer is applied over said passivating layer, a layer of photoresist is applied over said inert layer, said photoresist exposed to a light pattern, developed to leave openings in the photoresist layer where the desired contact openings are to be formed, and the device contacted with one or more etchant solutions to propagate said openings through the inert and passivating layers to the substrate, the improvement which comprises applying as the inert layer a layer of undoped polycrystalline or amorphous silicon and employing an etchant solution for etching said inert layer which etches large diameter openings faster than small diameter openings such that small diameter openings in the photoresist layer are not propagated through said inert layer.

2. A method according to claim 1 wherein the thickness of said inert layer is at least twice the diameter of the small diameter openings.

3. A method according to claim 1 wherein said small openings have a diameter of less than about 2 microns.

4. A method according to claim 1 wherein said etchant solution is an aqueous solution of nitric and hydrofluoric acids in a proportion of from about 65 to 99 volume percent of 70 percent by weight nitric acid and from about 35 to 1 volume percent of 49 percent by weight hydrofluoric acid.

5. A method according to claim 1 wherein said inert layer is undoped polycrystalline silicon.

6. A method according to claim 4 in which said polycrystalline silicon layer is etched with an aqueous solution comprising 99 volume percent of 70 percent by weight HNO₃ and 1 volume percent of 49 percent by weight HF.

7. A method according to claim 1 in which the etching of said inert layer is carried out at a temperature below about 0° C.

8. A method according to claim 1 or 4 wherein said semiconductor is silicon.

9. A method according to claim 4 or 8 wherein said semiconductor is silicon having a p-n junction therein.

* * * * *